(12) United States Patent
Cellura et al.

(10) Patent No.: US 8,087,753 B2
(45) Date of Patent: Jan. 3, 2012

(54) METHOD FOR MODULAR ARRANGEMENT OF A SILICON BASED ARRAY AND MODULAR SILICON BASED ARRAY

(75) Inventors: Mark A. Cellura, Webster, NY (US); Peter J. Nystrom, Webster, NY (US); Scott J. Phillips, West Henrietta, NY (US); John P. Meyers, Rochester, NY (US); Lyle G. Dingman, Fairport, NY (US); Bryan R. Dolan, Rochester, NY (US)

(73) Assignee: Xerox Corporation, Norwalk, CT (US)

( * ) Notice: Subject to any disclaimer, the term of this patent is extended or adjusted under 35 U.S.C. 154(b) by 13 days.

(21) Appl. No.: 12/689,910

(22) Filed: Jan. 19, 2010

(65) Prior Publication Data

US 2011/0175219 A1    Jul. 21, 2011

(51) Int. Cl.
B41J 2/14   (2006.01)
B41J 2/16   (2006.01)
(52) U.S. Cl. .......................................................... 347/49
(58) Field of Classification Search .................... 347/42, 347/13, 49, 40, 50, 59, 63
See application file for complete search history.

(56) References Cited

U.S. PATENT DOCUMENTS

| 4,860,075 A | 8/1989 | Araghi et al. |
| 5,753,959 A | 5/1998 | Quinn et al. |
| 6,409,307 B1 * | 6/2002 | Akhavain et al. ............... 347/42 |
| 6,869,166 B2 * | 3/2005 | Brugue et al. .................. 347/49 |

OTHER PUBLICATIONS

U.S. Appl. No. 12/504,857, filed Jul. 17, 2009, Mantell et al.

* cited by examiner

*Primary Examiner* — Jenny L Wagner
(74) *Attorney, Agent, or Firm* — Simpson & Simpson, PLLC

(57) ABSTRACT

A silicon based module, including: a substrate; a first chip assembly fixed to the substrate, the first chip assembly including a first silicon chip and a first driver die having electrical circuitry; and a second chip assembly fixed to the substrate, the second chip assembly including a second silicon chip and a second driver die having electrical circuitry. Portions of the first and second chip assemblies are aligned in a longitudinal direction for the substrate; and portions of the first and second silicon chips are aligned in a width direction orthogonal to the longitudinal direction. Method for forming a silicon based module.

12 Claims, 5 Drawing Sheets

METHOD FOR MODULAR ARRANGEMENT OF A SILICON BASED ARRAY AND MODULAR SILICON BASED ARRAY

TECHNICAL FIELD

The present disclosure relates to a method for modularly arranging a silicon based array and a modular silicon based array, in particular, an array of modules arranged end to end.

BACKGROUND

FIG. 7 shows prior art multi-chip array 300 in which a series of individual chips 302 are placed end to end on a single substrate 304. Improper spacing can occur at the joints between the chips, impacting operation of the chips. For example, for chips with ink ejectors, jet interpolation may be needed at chip boundaries, and for photosensitive chips, imaging at the joints may be impaired. In addition, extending multi-chip silicon based arrays presents precision problems and requires the use of costly equipment and operations. Further, the desired operation of the individual chips cannot be fully tested before the chips are placed in the array. Many such multi-chip arrays do not enable easy rework of defective chips and rework of a defective chip in an array often results in damage to adjacent chips.

FIG. 8 shows prior art arrangement 400 of a plurality of printheads 402 arranged in a staggered stitch shift configuration, rather than a butted configuration. The arrangement includes four sets of printheads for yellow, cyan, magenta, and black, respectively. The staggered configuration eliminates spacing problems at the ends of the printheads by overlapping the printheads in process direction P. However, the configuration requires larger amounts of space in the process direction for the multiple rows of modules. A typical width 404 for a printhead 402 is about three inches and a typical resolution for a printhead 402 is 600 spots per inch. In FIG. 8, printheads are assumed to be separated by one inch in t4he process direction. Thus, arrangement 400 provides full color printing capability of 600 spots per inch, but requires over 787 millimeters in the process direction.

SUMMARY

According to aspects illustrated herein, there is provided a method for forming a silicon based module, including: placing a first chip assembly on a substrate, the first chip assembly including a first silicon chip and a first driver die having electrical circuitry; placing a second chip assembly on the substrate, the second chip assembly including a second silicon chip and a second driver die with electrical circuitry; aligning portions of the first and second chip assemblies in a longitudinal direction for the substrate; and aligning portions of the first and second silicon chips in a width direction orthogonal to the longitudinal direction.

According to aspects illustrated herein, there is provided a method for modularly forming a silicon based array, comprising: placing a first chip assembly on a first substrate, the first chip assembly including a first silicon chip and a first driver die having electrical circuitry; placing a second chip assembly on the first substrate, the second chip assembly including a second silicon chip and a second driver die with electrical circuitry; aligning portions of the first and second chip assemblies in a first longitudinal direction for the first substrate; aligning portions of the first and second silicon chips in a first width direction orthogonal to the first longitudinal direction; and securing the first substrate to a base to form a first part of the array.

According to aspects illustrated herein, there is provided a method for modular arrangement of a silicon based array, including: placing a first silicon chip on a first substrate; placing a second silicon chip on the first substrate; aligning portions of the first and second silicon chips in a first width direction for the first substrate; placing a third silicon chip on a second substrate; placing a fourth silicon chip on the second substrate; aligning portions of the third and fourth silicon chips in a second width direction for the second substrate; aligning portions of the first and third silicon chips in a longitudinal direction orthogonal to the first and second width directions; aligning portions of the second and third silicon chips in the first or second width direction; and securing the first and second substrates to a base for the array.

According to aspects illustrated herein, there is provided a silicon based module, including: a substrate; a first chip assembly fixed to the substrate, the first chip assembly including a first silicon chip and a first driver die having electrical circuitry; and a second chip assembly fixed to the substrate, the second chip assembly including a second silicon chip and a second driver die having electrical circuitry. Portions of the first and second chip assemblies are aligned in a longitudinal direction for the substrate. Portions of the first and second silicon chips are aligned in a width direction orthogonal to the longitudinal direction.

According to aspects illustrated herein, there is provided a silicon based array, including: a first chip assembly on a first substrate, the first chip assembly including a first silicon chip and a first driver die having electrical circuitry, the first substrate fixed to a base for the array; and a second chip assembly on the first substrate, the second chip assembly including a second silicon chip and a second driver die with electrical circuitry, the second substrate fixed to a base for the array. Portions of the first and second chip assemblies are aligned in a longitudinal direction for the array; and portions of the first and second silicon chips are aligned in a width direction orthogonal to the longitudinal direction.

According to aspects illustrated herein, there is provided a silicon based array, including: first and second silicon chips on a first substrate, with respective portions aligned in a width direction for the array; and third and fourth silicon chips on a second substrate, with respective portions aligned in the width direction. Portions of the first and third silicon chips are aligned in a longitudinal direction orthogonal to width direction; and portions of the second and third silicon chips are aligned in the width direction.

According to aspects illustrated herein, there is provided a method for forming a silicon based array, including: alternately placing at least one first silicon chip and at least one second silicon chip on a first substrate, wherein a first silicon chip is closest to an end of the first substrate; alternately placing at least one third silicon chip and at least one fourth silicon chip on a second substrate, wherein a third silicon chip is closest to an end of the second substrate; aligning portions of the first and second substrates in a longitudinal direction for the array; aligning a portion of the first chip adjacent to the end of the first substrate with the third chip adjacent to the end of the second substrate in a width direction orthogonal to the longitudinal direction; and securing the first and second substrates to a base for the array.

According to aspects illustrated herein, there is provided a silicon based array, including: at least one first silicon chip and at least one second silicon chip alternately placed on a first substrate secured to a base for the array. A first silicon chip is closest to an end of the first substrate; and at least one third silicon chip and at least one fourth silicon chip alternately placed on a second substrate secured to the base. A third silicon chip is closest to an end of the second substrate. Portions of the first and second substrates are aligned in a longitudinal direction for the array; and a portion of the first chip adjacent to the end of the first substrate is aligned with the third chip adjacent to the end of the second substrate in a width direction orthogonal to the longitudinal direction.

According to aspects illustrated herein, there is provided a silicon based module, including: a substrate; first and second silicon chips on a first substrate; and first and second pluralities of repetitive silicon based structures associated with the first and second silicon chips, respectively. Each repetitive structure is a same type of structure. At least respective portions of the structures in the first plurality of repetitive silicon based structures are aligned in a longitudinal direction for the module. At least respective portions of the structures in the second plurality of repetitive silicon based structures are aligned in the longitudinal direction. The first and second pluralities of repetitive silicon based structures are positioned to conform to a critical dimension, the critical dimension being a required relative position for repetitive structures, adjacent with respect to the longitudinal direction, such that the adjacent repetitive structures or the module function in compliance with a performance parameter.

According to aspects illustrated herein, there is provided a silicon based array, including a base and a plurality of modules fixed to the base. Each module includes: a respective substrate; first and second silicon chips; and first and second pluralities of repetitive silicon based structures associated with the first and second silicon chips, respectively. Each repetitive structure is a same type of structure. At least respective portions of the structures in the first plurality of repetitive silicon based structures are aligned in a longitudinal direction for the module. At least respective portions of the structures in the second plurality of repetitive silicon based structures are aligned in the longitudinal direction. The first and second pluralities of repetitive silicon based structures are positioned to conform to a critical dimension, the critical dimension being a required relative position for adjacent repetitive structures such that the array functions in compliance with a performance parameter.

According to aspects illustrated herein, there is provided a silicon based array, including a base, a plurality of modules fixed to the base, and first and second pluralities of repetitive silicon based structures associated with the first and second silicon chips, respectively. Each module includes a respective substrate with first and second protrusions extending in a longitudinal direction for the module, and first and second silicon chips. Each repetitive structure is a same type of structure. At least respective portions of the structures in the first plurality of repetitive silicon based structures are aligned in a longitudinal direction for the module. At least respective portions of the structures in the second plurality of repetitive silicon based structures are aligned in the longitudinal direction. For each module, first and second repetitive silicon based structures, from the first and second pluralities of repetitive silicon based structures, respectively, are disposed in the first and second protrusions, respectively. For each module, the first and second pluralities of repetitive silicon based structures are positioned with respect to each other and with respect to the first and second protrusions to conform to a critical dimension, the critical dimension being a required relative position for adjacent repetitive structures such that the array functions in compliance with a performance parameter.

BRIEF DESCRIPTION OF THE DRAWINGS

Various embodiments are disclosed, by way of example only, with reference to the accompanying schematic drawings in which corresponding reference symbols indicate corresponding parts, in which.

DETAILED DESCRIPTION

In various figures, like reference numbers indicate like elements.

Figure 1:
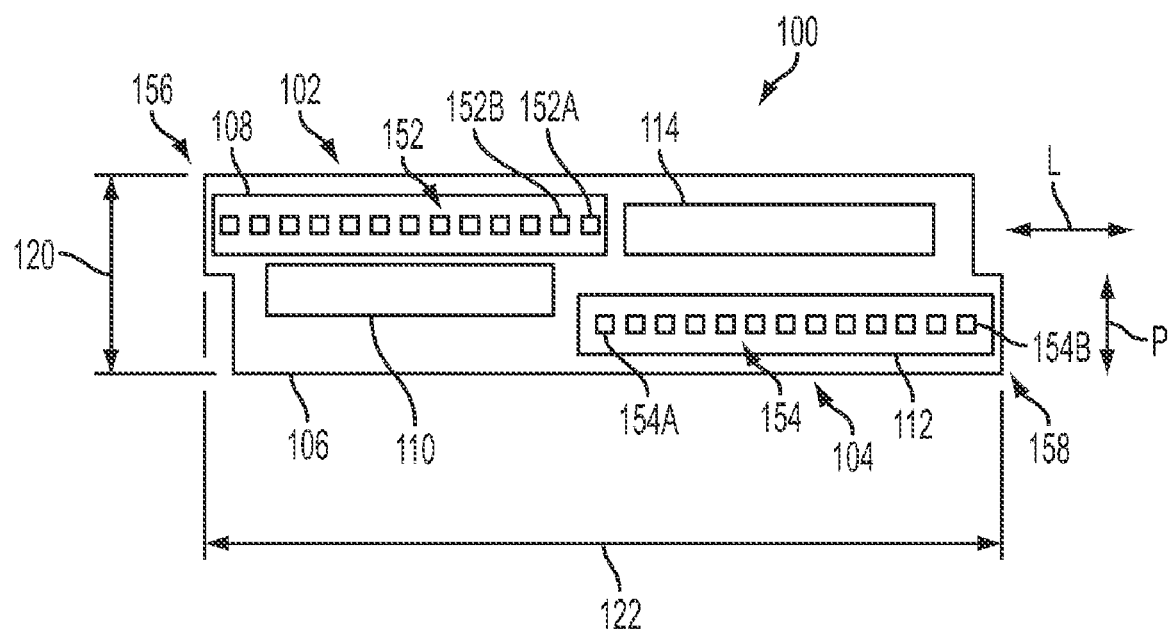
FIG. 1 is a plan view of a silicon based module.

FIG. 1 is a plan view of silicon based module 100. The module includes chip assemblies 102 and 104 on substrate 106. In an example embodiment, chip assembly 102 includes silicon chip 108 and driver die 110 having electrical circuitry. In an example embodiment, chip assembly 104 includes silicon chip 112 and driver die 114 having electrical circuitry. In an example embodiment, flex circuitry (not shown) is used to connect the driver dies to external circuitry and power. In an example embodiment, assemblies 102 and 104 are the same type of assembly or perform the same function. Respective portions of assemblies 102 and 104 are aligned in longitudinal direction L for the substrate. By longitudinal direction, we mean the long axis of the substrate, or a direction orthogonal to a process direction for a device in which the substrate is to be used, for example, in an array for a printing or scanning device. In an example embodiment, a substrate has width 120 less than longitudinal length 122. Respective portions of the silicon chips are aligned in width direction P orthogonal to the longitudinal direction.

Figure 2:
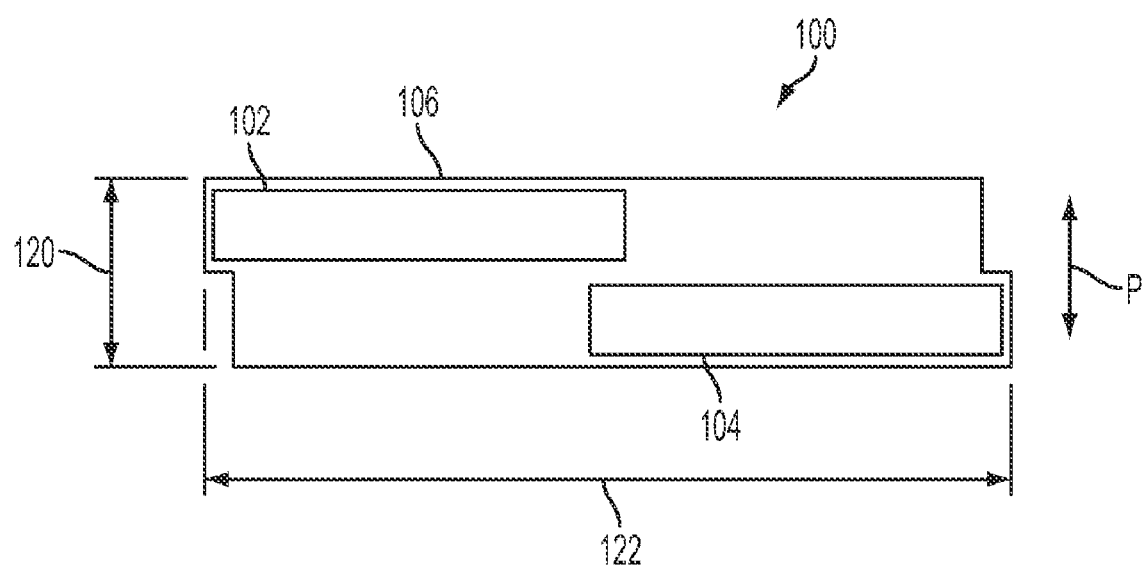
FIG. 2 is a plan view of a silicon based module.

FIG. 2 is a plan view of silicon based module 100. In FIG. 2, assemblies 102 and 104 are silicon chips, without respective driver dies, fixed to the substrate. In an example embodiment, the silicon chips are the same type of chip or perform the same function. Respective portions of the silicon chips are aligned in the P direction.

The following should be viewed in light of FIGS. 1 and 2. The silicon chips in

FIGS. 1 and 2 can be any chip known in the art, including, but not limited to a transducer, micro-electrical-mechanical-system chips, sensor chips, photosensitive chips, light-emitting chips, photosites in charge-coupled devices, photosites in light-emitting diodes, CMOS imager chips, capillary channel chips, and printhead chips. In an example embodiment, a printhead chip includes a plurality of ink ejectors. By "ink ejector" we mean a device with an ejector, for example, nozzle, which in response to an applied digital signal, emits, for example, ejects, a droplet of colorant to a desired small area of the sheet to form a pixel or a portion of a pixel. That is, the ejector provides a "drop on demand."

The substrate provides some or all of the following functionality for the respective chips or chip assemblies: a mechanical base, thermal transfer or isolation as needed, and fluidic or air connections as needed. The specific thermal transfer or isolation needed can be gauged and implemented in accordance with the thermal budget management for the module or for an array or machine in which the module is to be placed. In an example embodiment, the material for the substrate is selected to be properly thermally matched with structures, such as silicon-based chips or dies, to be connected to the substrate. For example, the coefficient of thermal expansion (CTE) for the material forming the substrate is matched as closely as possible with the CTE for the chips or dies to be connected to the substrate. Any material known in the art can be used for the substrate, including, but not limited to: ceramics such as aluminum nitride; metal alloys such as copper/tungsten and nickel/iron; metals such as aluminum, and glass. Chips or dies can be connected to a substrate by any means known in the art for semi-conductor die bonding, including, but not limited to adhesives, such as epoxies, and solder, such as eutectic solder.

Advantageously, virtually the full operation of one or both of assemblies 102 and 104, can be tested prior to securing the respective module in an array. In an example embodiment, assemblies 102 and 104 are printhead chips and testing the chips includes determining if the chips eject fluid at a desired rate or volume. Thus, potential defects can be identified in a module prior to placing the module in an array. Depending on the defect identified, the module may be repairable. This is advantageous because it is more costly and time consuming to address defects found in chips after the chips are part of an array. For example, it may be difficult or impossible to remove the defective chip from the array. In the first case, an undesirable amount of time and resources may be required, and in the second case, the expense of losing a fully assembled array may be incurred.

In an example embodiment, the alignment of chips or chip assemblies can be performed using flip chip or custom die bonding equipment and required tolerances can be obtained using machine vision. In an example embodiment, features are built into the die that enable a passive assembly technique using a precision reference tool. The overlap of the chips and chip assemblies in the process direction and the unique shape of the substrate enable global die placement allowance and also enable the formation of larger linear arrays without interference between modules.

Figure 3:
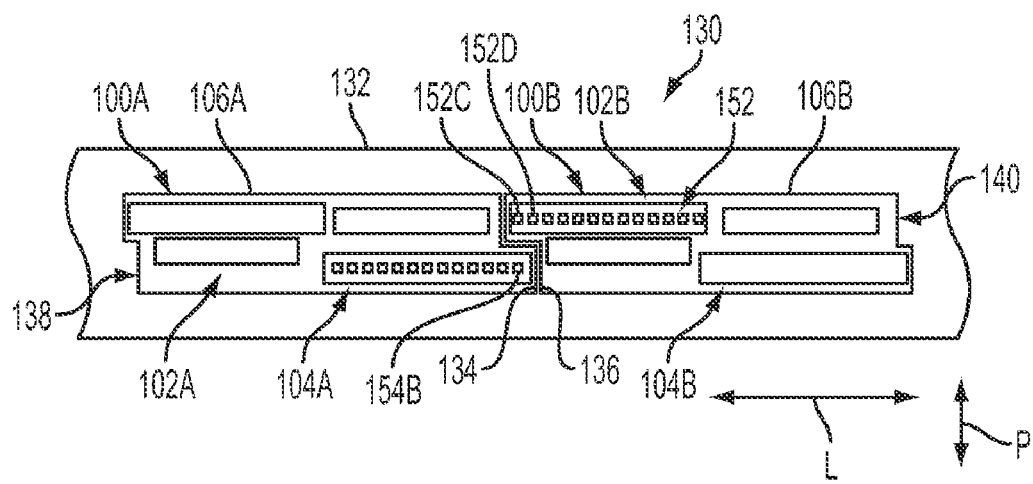
FIG. 3 is a plan view of an array with silicon based modules as shown in FIG. 1.

FIG. 3 is a plan view of array 130 with a plurality of silicon based modules as shown in FIG. 1. In FIG. 3, modules 100A and 100B are fixed by any means known in the art to base 132 for the array. Substrates 106A and 106B include ends 134 and 136, respectively, placed in close proximity. In an example embodiment (not shown), ends 134 and 136 are in contact. Respective portions of assemblies 102A and 102B are aligned in longitudinal direction L for the array. By longitudinal direction, we mean the long axis of the array, or a direction orthogonal to a process direction for a device in which the array is to be used, for example, in a printing or scanning device. Respective portions of assemblies 104A and 104B are aligned in the longitudinal direction. Respective portions of assemblies 104A and 102B are aligned in width direction P, orthogonal to direction L, for the array. In an example embodiment, all of assemblies 102A and 102B are aligned in longitudinal direction L. In an example embodiment, all of assemblies 104A and 104B are aligned in longitudinal direction L.

Figure 4:
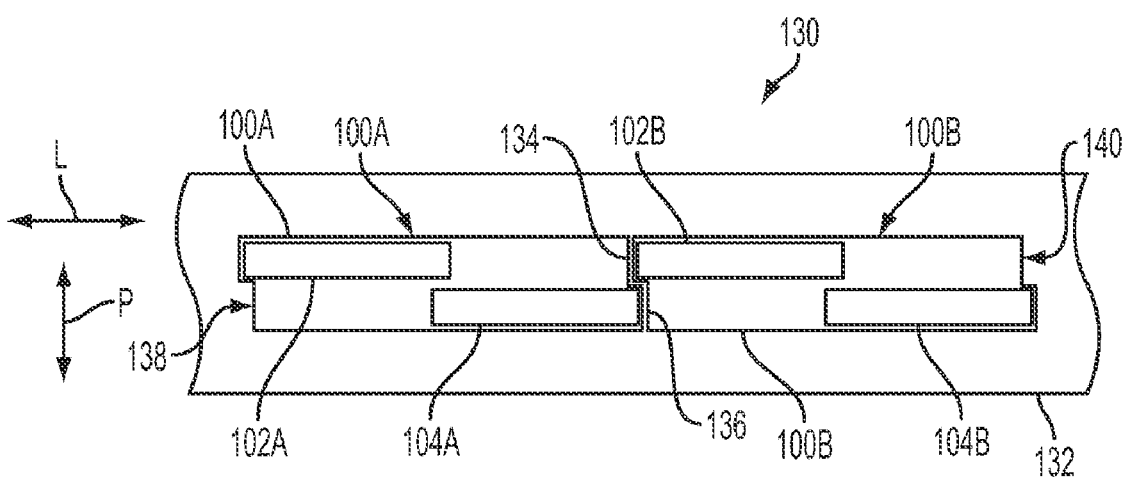
FIG. 4 is a plan view of an array with silicon based modules as shown in FIG. 2.

FIG. 4 is a plan view of array 130 with a plurality of silicon based modules as shown in FIG. 2. In FIG. 4, modules 100A and 100B are fixed by any means known in the art to base 132. Respective portions of assemblies 102A and 102B are aligned in longitudinal direction L for the array. Respective portions of assemblies 104A and 104B are aligned in the longitudinal direction. Respective portions of assemblies 104A and 102B are aligned in width direction P. In an example embodiment, all of assemblies 102A and 102B are aligned in longitudinal direction L. In an example embodiment, all of assemblies 104A and 104B are aligned in longitudinal direction L.

Modules can be connected to a base by any means known in the art, including, but not limited to adhesives or heat related processes, such as soldering, welding, or fusing. In an example embodiment, to enable removal of modules from the base, for example, to repair or replace the module, the method for connecting a module to a base is selected to enhance removal of the module. For example, adhesives amenable to removal, or fusing methods, such as plastic fusing, that enable cutting or separation of the fused portion without damage to the module or base.

In many applications, it is desirable or necessary for the chip assemblies, chips, or modules forming an array or arrays to fully cover in the width direction, for example, fully cover the width, of a sheet being printed or scanned. For example, as described supra for a printer application, printheads are overlapped so that the ink injectors for the chips in the arrays fully cover a sheet passing in process direction P. Advantageously, array 130 can provide full coverage in the width direction without the need for interpolation between chips and with a minimal amount of space in the process direction, as further discussed infra.

Figure 5:
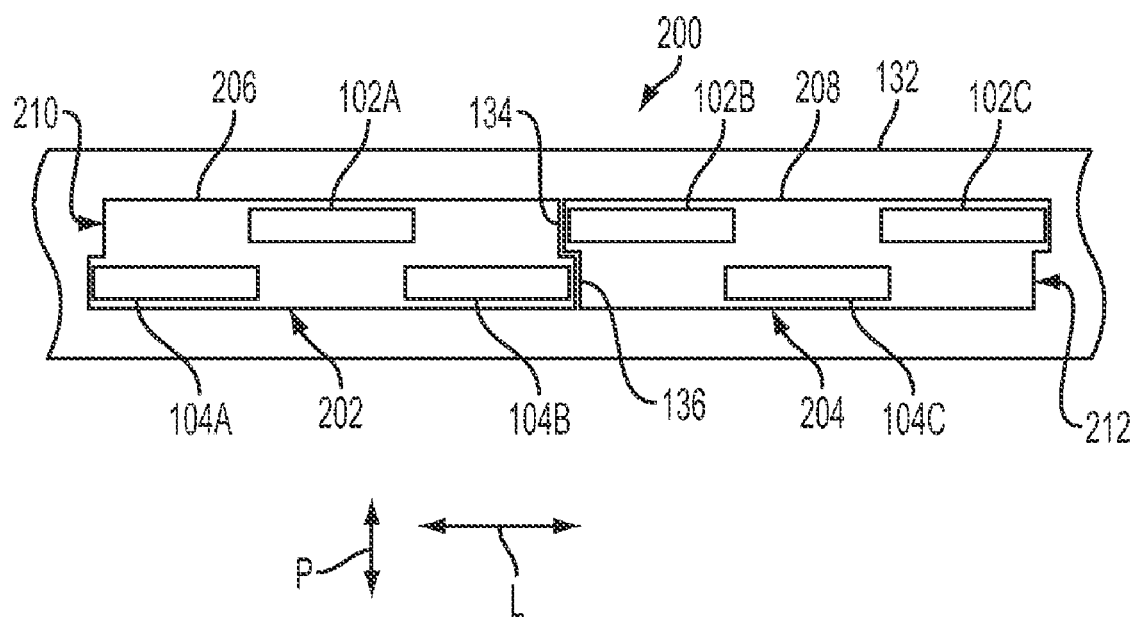
FIG. 5 is a plan view of an array with silicon based modules.

FIG. 5 is a plan view of array 200 with a plurality of silicon based modules. It should be understood that more than two silicon chips or silicon chip assemblies can be placed in a single module and that an array can be formed using modules with more than two silicon chips or silicon chip assemblies. In FIG. 5, two modules with three chips each are shown. However, it should be understood that different numbers of modules and different numbers of chips per module are possible. In FIG. 5, modules 202 and 204 are secured to base 132 by any means known in the art and aligned in longitudinal direction L (defined supra) for the array. Each substrate includes at least one assembly 102 and at least one assembly 104 alternately placed on the substrate. That is, assemblies 102 and 104 alternate in direction L. In FIG. 5, module 202 includes assemblies 102A, 104A, and 104B and module 204 includes assemblies 102B, 102C, and 104C. In an example embodiment, the assemblies are the same type of chip or perform the same function.

Substrates 206 and 208 include ends 134 and 136, respectively, placed in close proximity. In an example embodiment (not shown), ends 134 and 136 are in contact. Respective portions of assemblies 102A/B/C are aligned in direction L. Respective portions of assemblies 104A/B/C are aligned in the longitudinal direction. In an example embodiment, all of assemblies 102A/B/C are aligned in longitudinal direction L. In an example embodiment, all of assemblies 104A/B/C are aligned in longitudinal direction L.

For each module, one of assemblies 102 or 104 is closest to, or alternately stated, adjacent to, end 134 or 136 for the respective substrate. A portion of the assembly adjacent to the end of one substrate is aligned with the assembly in an adjacent module in width direction P orthogonal to the longitudinal direction. The assembly in the adjacent module is adjacent to the end of the substrate for the module. For example, a portion of assembly 102B is aligned with assembly 104B in direction P.

The following should be viewed in light of FIGS. 1-5. The shape of substrates 106, 206, and 208 enable adjacent substrates to be placed very close together. For example, substrate 106 includes complementary indentations 138 and 140 and substrates 206 and 208 include complementary indentations 210 and 212, respectively. For substrates adjacent in the longitudinal direction, the indentations fit together to enable the chip or chip assembly alignments noted above.

The configurations of array 130 with an even number (two) of chips or chip assemblies per module can be extended to other greater even numbers of chips or chip assemblies per module. The configuration of array 200 with an odd number (three) of chips or chip assemblies per module can be extended to other greater odd numbers of chips or chip assemblies per module.

Figure 6:
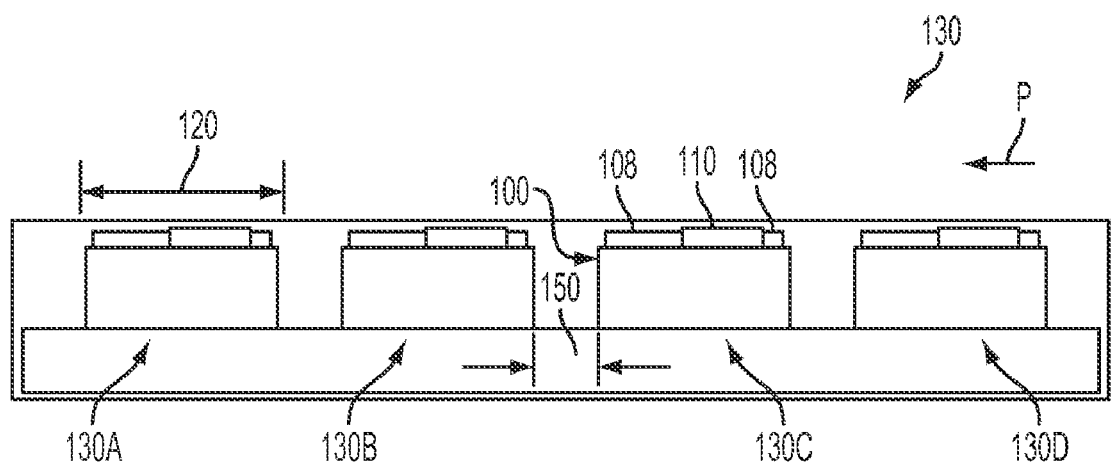
FIG. 6 is an end view of four silicon based arrays with silicon based modules as shown in FIG. 1.
Figure 7:
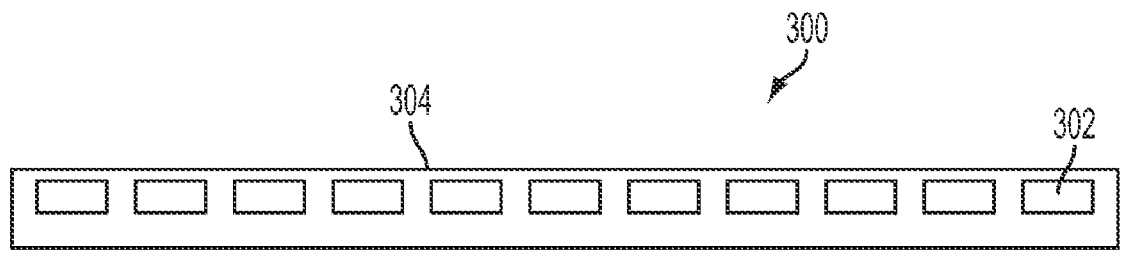
FIG. 7 shows a prior art multi-chip array in which a series of individual chips is placed end to end on a single substrate; and, FIG. 8 shows a prior art arrangement of a plurality of printhead modules arranged in a staggered stitch shift configuration.
Figure 8:
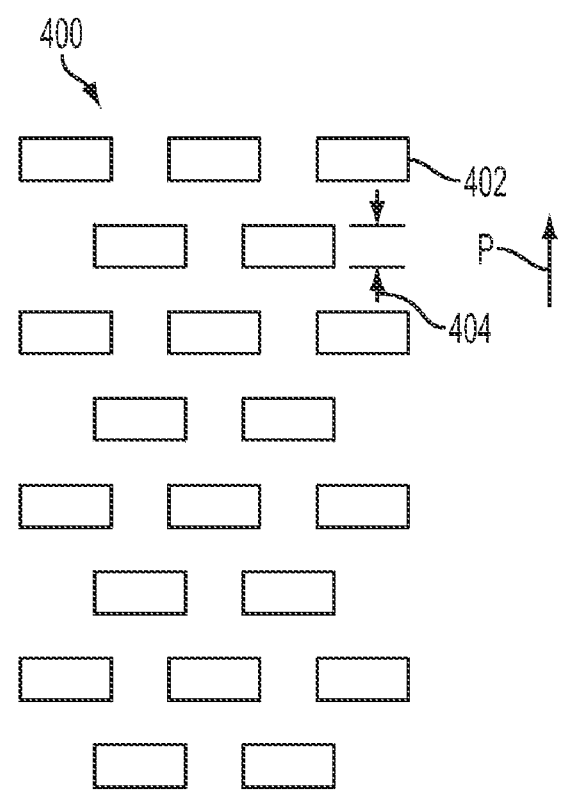

FIG. 6 is an end view of four silicon based arrays 130 with a plurality of silicon based modules 100 as shown in FIG. 1. In an example embodiment, FIG. 6 includes arrays 130A-D for yellow, cyan, magenta, and black, respectively, although other color combinations are possible. Although four arrays are shown in FIG. 6, it should be understood that other numbers of arrays are possible for array 132. Although arrays 130A-D are shown with modules as shown in FIG. 1, it should be understood that modules as shown in FIG. 2 also can be used in the array. Any number of modules can be included in arrays 130A-D. The discussion regarding array 130 for FIGS. 1 and 2 is applicable to each of arrays 130A-D. Substrates 106 have respective widths 120. In an example embodiment, the width is six millimeters. Respective modules in arrays 130A-D are separated by distance 150 in process direction P. Distance 150 is no greater than one third of width 120. In an example embodiment, distance 150 is two millimeters. Advantageously, the space between arrays in FIG. 6 in the process direction, referred to as "waterfront," is greatly reduced in comparison to the staggered printhead arrangements mentioned supra.

In an example embodiment, each module in arrays 130A-D is capable of printing an image with a resolution of 180 spots per inch. Thus, with a dimension in the process direction of only 126 millimeters, arrays 130A-D are able to provide full color resolution printing at 720 spots per inch. As noted supra, a stitched printhead arrangement would require over 787 millimeters to print at a lower resolution of 600 spots per inch.

The following is applicable to FIGS. 1 and 2. The discussion that follows is directed to FIG. 1; however, it should be understood that the discussion is not limited to FIG. 1. In an example embodiment, module 100 includes pluralities 152 and 154 of repetitive silicon based structures associated with assemblies 102 and 104, respectively. In an example embodiment, pluralities 152 and 154 of repetitive silicon based structures are formed in assemblies 102 and 104, respectively. Note that to simplify presentation, only a small number of structures are shown in FIG. 1. It should be understood that module 100 is not limited to a particular number of structures. In an example embodiment, each repetitive structure is a same type of structure. In an example embodiment, at least respective portions of the structures in the plurality 152 are aligned in a direction L. In an example embodiment, at least respective portions of the structures in plurality 154 are aligned in direction L. In an example embodiment, pluralities 152 and 154 have the same number of structures in each.

Pluralities 152 and 154 are positioned to conform to a critical dimension. The critical dimension is a required relative position for repetitive structures, adjacent with respect to direction L, such that the adjacent repetitive structures or the module function in compliance with a performance parameter. For example, when the module is placed in a machine, for example, in an array in a printer or scanner, the structures or the module function in compliance with a performance parameter.

Some or all of each structure has a same configuration or function and the structure is repeated, for example, in assembly 102. Alternatively stated, the operational components of a chip assembly or chip are a repeating series of silicon based structures having some or all of the same configuration or function.

For example, if assemblies 102 and 104 are injector/printer chips, then structures 152 and 154 are ink injectors. If module 100 is placed in a printer, a critical dimension would be a relative position of the injectors such that the chips apply colorant to a specified area at a specified density of coverage, for example, for a portion of a sheet of material passing through the printer in a process direction and past the module. In an example embodiment, a structure can be a portion of an ink jet ejector. For example, an assembly or chip could have formed therein either channels or heating resistors.

As another example, if assemblies 102 and 104 are photo-sensitive chips, then structures 152 and 154 are photo-sensitive sites. If module 100 is placed in a scanner, a critical dimension would be a relative position of the structures such that the chips fully scan a portion of a sheet of material passing through the scanner in a process direction and past the module. For example, there is not a gap in scanning coverage between the chips. In another example, if injectors or photo-sensitive sites (structures) on an injector/print chip or photo-sensitive chip, respectively, are spaced at specified distances on the chip, the positioning of the pluralities of structures maintains the specified spacing between structures on adjacent pluralities of structures.

In an example embodiment, at least one structure in plurality 152, for example, structure 152A, is aligned in direction P with at least one structure in the plurality 154, for example, structure 154A. In an example embodiment, at least one structure in plurality 152, for example, structure 152B, is positioned to conform to the critical dimension with at least one structure in the plurality 154, for example, structure 154A. For example, structures 152B and 154A maintain the specified spacing between structures in the pluralities of structures.

The following is applicable to FIGS. 3 and 4. The discussion that follows is directed to FIG. 3; however, it should be understood that the discussion is not limited to FIG. 3. The discussion regarding pluralities 152 and 154 is applicable to FIGS. 3 and 4. Array 130 includes a plurality of modules 100. In an example embodiment, respective pluralities 152 and 154 are positioned to conform to a critical dimension that is a required relative position for adjacent repetitive structures such that the array functions in compliance with a performance parameter. The discussion supra regarding a critical dimension is generally applicable to array 130. In an example embodiment, adjacent pairs of modules, for example, modules 100A/B are positioned such that repetitive structures at the respective ends of the adjacent modules are positioned to conform to the critical dimension.

For example, if assemblies 102 and 104 are injector/printer chips, then structures 152 and 154 are ink injectors. If array 100 is placed in a printer, a critical dimension would be a relative position of the injectors such that the array applies colorant to a specified area at a specified density of coverage, for example, for a portion of a sheet of material passing through the printer in a process direction and past the array. As another example, if assemblies 102 and 104 are photo-sensitive chips, then structures 152 and 154 are photo-sensitive sites. If array 130 is placed in a scanner, a critical dimension would be a relative position of the structures such that the array fully scans a portion of a sheet of material passing through the scanner in a process direction and past the array. For example, there is not a gap in scanning coverage between the modules in the array. In another example, if injectors or photo-sensitive sites (structures) on an injector/print chip or photo-sensitive chip, respectively, are spaced at specified distances on a chip, the positioning of the modules and the pluralities of structures maintains the specified spacing between structures on adjacent modules.

In an example embodiment, at least one structure in plurality 152, for example, structure 152C, for one module in a pair of adjacent modules in the array is aligned in direction P with at least one structure in plurality 154, for example, structure 154B, for the other module in the pair. In an example embodiment, at least one structure in plurality 152, for example, structure 152D, for one module in a pair of adjacent modules in the array is positioned to conform to the critical dimension with at least one structure in plurality 154, for example, structure 154B, for the other module in the pair. For example, structures 152D and 154B maintain the specified spacing between structures in the pluralities of structures.

Returning to FIGS. 1 and 2, substrate 106 includes protrusions 156 and 158 extending in the longitudinal direction for the module. Respective repetitive silicon based structures are at least partially disposed in the protrusions. For example, structures 152C and 154B are partially disposed in protrusions 152 and 154, respectively. The repetitive structures are positioned with respect to each other and with respect to the protrusions to conform to a critical dimension. In an example embodiment, the critical dimension is a required relative position for adjacent repetitive structures such that the array functions in compliance with a performance parameter.

The following is applicable to FIGS. 1-5. The following discussion is directed to array 130 in FIG. 3; however, it should be understood that the discussion is not limited to FIG. 3. By critical dimension with respect to the shape of a substrate, for example, protrusions 156 and 158, we mean a required relative position for adjacent repetitive structures such that when modules are placed in an arrangement, for example, array 130, with other modules, the arrangement functions in compliance with a performance parameter. In this context, a critical dimension is directed to structures at least partially disposed in protrusions for a module.

For example, for adjacent pairs modules, for example, modules 100A/B in array 130, a repetitive structure partially disposed in the protrusion for one of the modules, for example, structure 152C in protrusion 156 for module 100B, and a repetitive structure partially disposed in the protrusion for the other of the modules, for example, structure 154B in protrusion 158 for module 100A, conform to the critical dimension. In an example embodiment, for adjacent pairs modules, for example, modules 100A/B in array 130, a repetitive structure partially disposed in the protrusion for one of the modules, for example, structure 152C in protrusion 156 for module 100B, and a repetitive structure partially disposed in the protrusion for the other of the modules, for example, structure 154B in protrusion 158 for module 100A, overlap in direction P.

Thus, modules are formed to interlock with other modules, for example, protrusions 156 and 158 form an interlocking configuration in array 130. Further, the critical dimensionality of the repetitive structures is incorporated in the interlocking configuration. For example, the size and shape of protrusions 156 and 158, and the position of repetitive structures with respect to the protrusions is such that the critical dimensionality is maintained when modules are interlocked. For example, the critical dimension for structures 152D and 154B are maintained in array 130. For example, if injectors or photo-sensitive sites on an injector/print chip or photo-sensitive chip, respectively, are spaced at specified distances on chips, the positioning of the modules maintains the specified spacing of the structures between adjacent modules. For example, the specified spacing is maintained between injectors or sites on assemblies 102B and 104A (structures 152D and 154B).

Advantageously, the overlap of repetitive structures, for example, within a module or between modules in an array, enables redundant functionality in process direction P for a module or for an array of modules. For example, in FIG. 1, assemblies 102B and 104A overlap in direction P (structures 152C and 154B) and portions of each assembly cover a same area in the P direction. The use of the portions of the assemblies in the overlapped region can be controlled by any means known in the art, for example, by software control. For example, the portion for one of the assemblies can be activated in the overlapped region, while the portion for the other assembly is deactivated in the overlapped region. Further, if the portion for one of the assemblies in the overlapped region malfunctions, the portion for the other assembly, aligned in the P direction with the malfunctioning portion of the first assembly, can be used to carry out the desired function in the overlapped region. For example, both structures 152C and 154B cover a same area in the P direction and either structure can be used to carry out a function for that area.

The overlap between repetitive structures noted above also minimizes or eliminates concerns noted supra regarding spacing in the L direction between adjacent structures, and maintaining a critical dimension between structures in the L direction. For example, the overlaps noted above eliminate the need to butt ends of adjacent structures or adjacent modules, or maintain very tight tolerances for spacing between adjacent structures. The overlap ensures that there is no undesired space in the L direction between structures in a module or in an array of modules that must be accounted for. For example, the overlap ensures that one or both of the overlapped structure or modules is able to provide the desired functionality in the overlap area.

It will be appreciated that various of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

What we claim is:

1. A silicon based module, comprising:
  a substrate;
  a first chip assembly, including a first silicon chip and a first driver die having electrical circuitry, the first silicon chip and the first driver circuit each directly fixed to a surface of the substrate; and,
  a second chip assembly, including a second silicon chip and a second driver die having electrical circuitry, the second silicon chip and the second driver circuit each directly fixed to the surface of the substrate, wherein:
  respective portions of the first and second chip assemblies are aligned in a longitudinal direction for the substrate; and,
    respective portions of the first and second silicon chips are aligned in a width direction orthogonal to the longitudinal direction.

2. The module of claim 1 wherein the first and second silicon chips are selected from the group consisting of a transducer, micro-electrical-mechanical-system chips, sensor chips, photosensitive chips, light-emitting chips, photosites in charge-coupled devices, photosites in light-emitting diodes, CMOS imager chips, capillary channel chips, and printhead chips.

3. A silicon based array, comprising:
a first chip assembly on a first substrate, the first chip assembly including a first silicon chip and a first driver die having electrical circuitry, the first substrate fixed to a base for the array; and,
a second chip assembly on the first substrate, the second chip assembly including a second silicon chip and a second driver die with electrical circuitry, the second substrate fixed to a base for the array, wherein:
respective portions of the first and second chip assemblies are aligned in a longitudinal direction for the array;
respective portions of the first and second silicon chips are aligned in a width direction orthogonal to the longitudinal direction; and,
the first and second silicon chips and the first and second driver dies, respectively, are at least partially aligned with respect to each other in a width direction, orthogonal to a longitudinal direction for the array.

4. The array of claim 3 wherein the first and second silicon chips are selected from the group consisting of a transducer, micro-electrical-mechanical-system chips, sensor chips, photosensitive chips, light-emitting chips, photosites in charge-coupled devices, photosites in light-emitting diodes, CMOS imager chips, capillary channel chips, and printhead chips.

5. The array of claim 3 wherein operation of the first or second silicon chips is tested prior to securing the first substrate to the base.

6. The array of claim 5 wherein:
the first and second silicon chips are respective printhead chips; and,
testing the first or second silicon chip includes determining if the respective printhead chip ejects fluid at a desired rate or volume.

7. The array of claim 3 further comprising:
a third chip assembly on a second substrate, the third chip assembly including a third silicon chip and a third driver die including electrical circuitry, the second substrate fixed to the base; and,
a fourth chip assembly on the second substrate, the fourth chip assembly including a fourth silicon chip and a fourth driver die including electrical circuitry, the second substrate fixed to the base, wherein:
respective portions of the third and fourth chip assemblies are aligned in the longitudinal direction; and,
respective portions of the third and fourth silicon chips are aligned in the width direction.

8. The array of claim 7 wherein operation of the third or fourth silicon chip is tested prior to securing the second substrate to the base.

9. The array of claim 8 wherein:
the third and fourth silicon chips are respective printhead chips; and,
testing operation of the third or fourth silicon chip includes determining if the respective printhead chip ejects fluid at a desired rate or volume.

10. The array of claim 7 wherein:
respective portions of the first and third chip assemblies are aligned in the longitudinal direction; or,
respective portions of the second and fourth silicon chip assemblies are aligned in the longitudinal direction; and,
respective portions of the second and third silicon chips are aligned in the width direction.

11. The array of claim 10 wherein:
all of the first silicon chip overlaps the third silicon chip in the longitudinal direction; or,
all of the second silicon chip overlaps the fourth silicon chip in the longitudinal direction.

12. The array of claim 3 further comprising:
a third chip assembly on a second substrate, the third chip assembly including a third silicon chip and a third driver die including electrical circuitry, the second substrate fixed to the base; and,
a fourth chip assembly on the second substrate, the fourth chip assembly including a fourth silicon chip and a fourth driver die including electrical circuitry, the second substrate fixed to the base, wherein:
the first and second substrates have respective widths in the first and second width directions equal to a first value;
respective portions of the first and second substrates are aligned in the width direction; and,
the first and second substrates are separated, in the width direction, by a distance equal to a second value no greater than one third of the first value.

* * * * *